United States Patent
Suzuki et al.

(10) Patent No.: US 11,708,383 B2
(45) Date of Patent: Jul. 25, 2023

(54) ORGANIC BORANE COMPLEX, COMPOSITION CONTAINING ORGANIC BORANE, AND ORGANIC ELECTROLUMINESCENT ELEMENT

(71) Applicant: Konica Minolta, Inc., Tokyo (JP)

(72) Inventors: Takatugu Suzuki, Hachioji (JP); Hiroshi Kita, Hachioji (JP); Yuichi Kitamoto, Sendai (JP); Shuichi Oi, Sendai (JP)

(73) Assignee: KONICA MINOLTA, INC., Tokyo (JP)

( * ) Notice: Subject to any disclaimer, the term of this patent is extended or adjusted under 35 U.S.C. 154(b) by 842 days.

(21) Appl. No.: 16/334,686

(22) PCT Filed: Sep. 28, 2017

(86) PCT No.: PCT/JP2017/035089
§ 371 (c)(1),
(2) Date: Mar. 19, 2019

(87) PCT Pub. No.: WO2018/074167
PCT Pub. Date: Apr. 26, 2018

(65) Prior Publication Data
US 2021/0292342 A1    Sep. 23, 2021

(30) Foreign Application Priority Data

Oct. 18, 2016 (JP) .................................. 2016-204632

(51) Int. Cl.
| | |
|---|---|
| *C07F 5/02* | (2006.01) |
| *H10K 85/30* | (2023.01) |
| *H10K 85/60* | (2023.01) |
| *H10K 50/15* | (2023.01) |
| *H10K 50/16* | (2023.01) |
| *H10K 50/17* | (2023.01) |

(52) U.S. Cl.
CPC ............ *C07F 5/027* (2013.01); *H10K 85/322* (2023.02); *H10K 85/60* (2023.02); *H10K 85/657* (2023.02); *H10K 50/15* (2023.02); *H10K 50/16* (2023.02); *H10K 50/17* (2023.02); *H10K 50/171* (2023.02)

(58) Field of Classification Search
CPC .... C07F 5/027; H01L 51/005; H01L 51/5012; H01L 51/5056; H01L 51/5072; H01L 51/5088; H01L 51/5092; H01L 51/5096; H01L 51/0071; H01L 51/008
See application file for complete search history.

(56) References Cited

U.S. PATENT DOCUMENTS

| | | | | |
|---|---|---|---|---|
| 2018/0040821 | A1* | 2/2018 | Hatakeyama | .......... C09K 11/06 |
| 2018/0069182 | A1* | 3/2018 | Hatakeyama | ....... H01L 51/0094 |
| 2018/0366653 | A1* | 12/2018 | He | ...................... H01L 51/0072 |
| 2019/0013478 | A1* | 1/2019 | Iijima | ................. H01L 51/0071 |

FOREIGN PATENT DOCUMENTS

| | | | | |
|---|---|---|---|---|
| CN | 106467553 A | * | 3/2017 | ............. C07F 5/02 |
| JP | H1180225 | * | 3/1999 | ............. C08F 10/00 |
| JP | H1180225 A | * | 3/1999 | ............. C08F 10/00 |
| JP | 2011-057990 A | | 3/2011 | |
| JP | 2013-56859 A | | 3/2013 | |
| WO | 2016/143624 A1 | | 9/2016 | |
| WO | 2016/152418 A1 | | 9/2016 | |
| WO | WO-2017018326 A1 | * | 2/2017 | ............. C09K 11/06 |
| WO | WO-2017092508 A1 | * | 6/2017 | ............. C07F 5/027 |

OTHER PUBLICATIONS

Tai et al. ("Theoretical Design of π-Conjugated Heteropolycyclic Compounds Containing a Tricoordinated Boron Center", The Journal of Physical Chemistry C, Jul. 2013, vol. 112, pp. 14999-15008) (Year: 2013).*
JPO, Office Action for the related Japanese Patent Application No. 2018-546214, dated Apr. 20, 2021, with English translation.
International Preliminary Report on Patentability and Written Opinion of the International Searching Authority dated Apr. 23, 2019 from corresponding International Application No. PCT/JP2017/035089 and English translation.
International Search Report dated Dec. 12, 2017 for PCT/JP2017/035089 and English translation.
Hirai, Hiroki et al., One-step borylation of 1,3-diaryloxybenzenes towards efficient materials for organic light-emitting diodes, Angewandte Chemie, international edition, 2015, 54 (46), pp. 13581-13585, abstract, p. 13582, fig. 1.

* cited by examiner

*Primary Examiner* — Rosalynd A Keys
(74) *Attorney, Agent, or Firm* — Lucas & Mercanti, LLP

(57) ABSTRACT

An organic borane complex contains, as a component, triarylborane having an enhanced bonding between a boron atom and a carbon atom on an aryl group. The organic borane complex contains, as a component, triarylborane having a structure represented by the following general formula (1), wherein X1 and X2 each independently represent an oxygen atom or a sulfur atom; X3 and X4 each independently represent a hydrogen atom or a substituent, or X3 and X4 are linked together to be a single atom; R1 to R3 each independently represent a hydrogen atom or a substituent; and p, q and r each independently represent an integer of 1 to 3. Also disclosed are a composition containing organic borane, and an organic electroluminescent element.

3 Claims, 5 Drawing Sheets

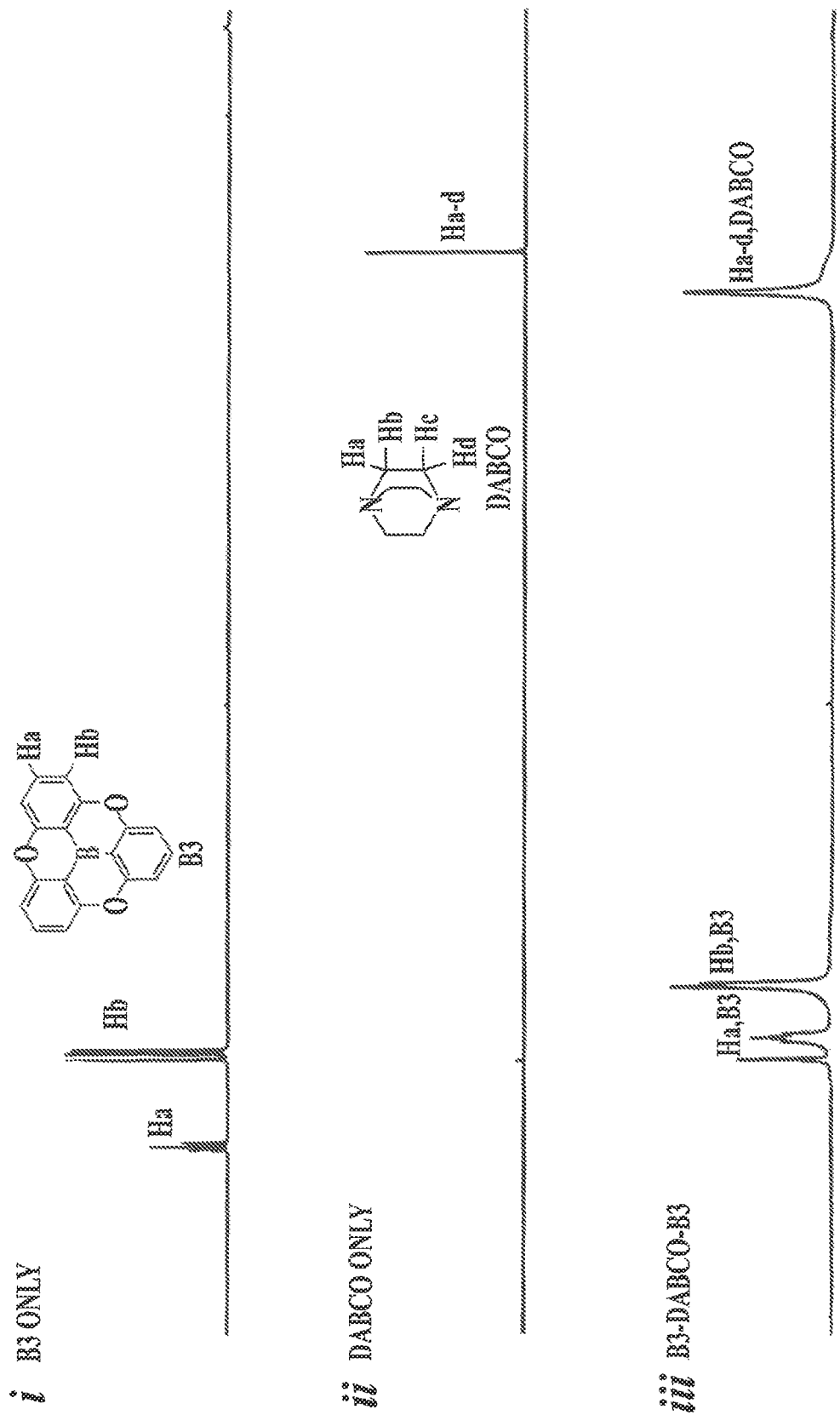

ORGANIC BORANE COMPLEX, COMPOSITION CONTAINING ORGANIC BORANE, AND ORGANIC ELECTROLUMINESCENT ELEMENT

The present U.S. Patent Application is U.S. National Phase Application under 35 U.S.C. 371 of International Application No. PCT/JP2017/035089 filed on Sep. 28, 2017. This application claims a priority under the Paris Convention of Japanese Patent Application No. 2016-204632 filed on Oct. 18, 2016, the entire disclosure of which is incorporated herein by reference in its entirety.

TECHNICAL FIELD

The present invention relates to an organic borane complex, a composition containing organic borane, and an organic electroluminescent element. More particularly, the present invention relates to an organic borane complex containing, as a component, triarylborane having an enhanced bonding between a boron atom and a carbon atom on an aryl group, and so on.

BACKGROUND ART

A boron atom is an element having an atomic number of 5 in the periodic table, belonging to Group 13 of the periodic table and having a valence of 3, the electron configuration thereof in the atomic state is $(1S)^2, (2S)^2, (2P)^1$, and by the use of one 2S orbital and two 2P orbitals, a $SP^2$ hybrid orbital can be formed.

In these three $SP^2$ orbitals, equivalent electrons are arranged one by one (three in total), whereby the boron atom can form a covalent bond together with an element of carbon, oxygen, nitrogen or the like, so that the boron atom is an element that can also be treated as if it is a trivalent substituent. On the other hand, since there is one remaining unoccupied 2P orbital, a boron-containing compound naturally exhibits electron deficiency.

Consequently, a triarylborane-based compound in which a boron atom and three aryls are bonded through boron-carbon bonds is basically subject to receiving electrons because of this electron deficiency of the boron atom, and easily undergoes interaction or chemical reaction (also referred to as complexation hereinafter) with a compound having an unshared electron pair or a metal, that is, a coordinate-bonding substance. At this time, the bond between boron and the aryl group becomes a $SP^3$ orbital.

Some organic borane complexes formed of triarylborane and coordinate-bonding substances are known (see, for example, Patent Literature 1). However, the stability of a triarylborane-based compound used as a component (also referred to as a building block hereinafter) of the organic borane complexes is low, and therefore, special devices or techniques have been needed for the handling thereof, for example, handling has been carried out in the absence of air or in an inert gas such as nitrogen. Accordingly, further improvement has been desired so as to obtain a higher yield by a simple operation.

Alternatively, a technique to make the surroundings of the boron atom of the triarylborane sterically bulky by means of an alkyl group or an aryl group in order to improve stability of triarylborane is known (see, for example, Patent Literature 2). Although such a technique improves stability, there is room for improvement in view of an increase in types of the coordinate-bonding substance that undergoes complexation with the triarylborane-based compound.

As described above, in the molecular design of an organic borane complex containing triarylborane as a component, ease of complexation and stability of the compound are in a trade-off relationship in the conventional techniques.

CITATION LIST

Patent Literature

Patent Literature 1
  Japanese Patent Laid-Open No. 2011-057990
Patent Literature 2
  Japanese Patent Laid-Open No. 2013-56859

SUMMARY OF INVENTION

Technical Problem

The present invention has been made in the light of the above problem and circumstances, and the present invention addresses the problem of providing an organic borane complex containing, as a component, triarylborane having an enhanced bonding between a boron atom and a carbon atom on an aryl group, a composition containing organic borane, and an organic electroluminescent element.

Solution to Problem

In order to solve the above problem, the present inventors have studied causes of the problem, etc., and in order to improve stability of triarylborane, they have focused on a molecular design of triarylborane in which a boron atom is bonded to three aryl groups through boron-carbon bonds, specifically, a molecular design for at least two combinations of aryl groups of the three aryl groups of the compound, the three aryl groups being adjacent to one another through an electron donative divalent atom centering the boron atom.

As a result, the present inventors have found that by using, as a component, triarylborane having small steric hindrance and having been crosslinked by an electron donative divalent atom, stability of an organic borane complex of the triarylborane and a substance capable of forming a coordinate bond, such as a compound having an unshared electron pair, a metal or a metal compound, can be improved, and they have achieved the present invention.

To achieve at least one of the abovementioned objects, an aspect of the present invention is as follows.

1. An organic borane complex comprising, as a component, triarylborane having a structure represented by the following general formula (1):

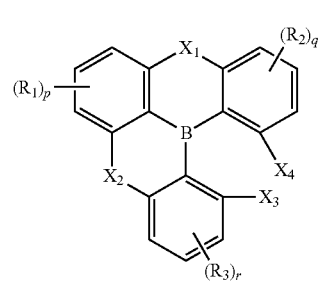

General formula (1)

wherein $X_1$ and $X_2$ each independently represent an oxygen atom or a sulfur atom; $X_3$ and $X_4$ each independently represent a hydrogen atom or a substituent, or $X_3$ and $X_4$ are linked together to be a single atom; $R_1$ to $R_3$ each independently represent a hydrogen atom or a substituent; and p, q and r each independently represent an integer of 1 to 3.

BRIEF DESCRIPTION OF DRAWINGS

The advantages and features provided by one or more embodiments of the invention will become more fully understood from the detailed description given hereinbelow and the appended drawings which are given by way of illustration only, and thus are not intended as a definition of the limits of the present invention.

FIG. 4 is an NMR chart of an organic borane complex of the present invention and comparative compounds.

DESCRIPTION OF EMBODIMENTS

Figure 1:
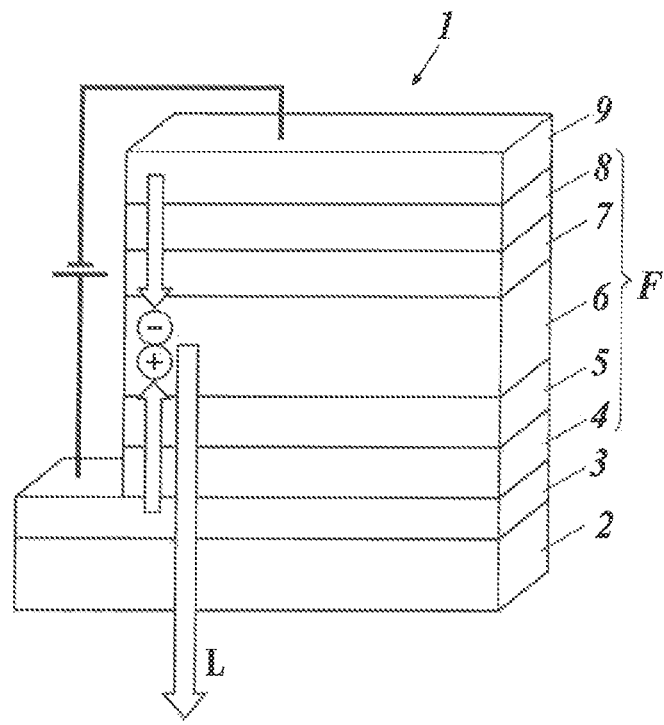
FIG. 1 is a schematic view showing an example of a structure of an organic EL element.

Hereinafter, one or more embodiments of the present invention will be described with reference to the drawings. However, the scope of the invention is not limited to the disclosed embodiments.

The organic borane complex of the present invention is characterized by containing, as a component, triarylborane having a structure represented by the general formula (1).

This characteristic is a technical characteristic common to or corresponding to the invention according to the following embodiment.

In view of exhibiting the effects of the present invention, it is preferable that in the general formula (1), $X_3$ and $X_4$ be linked together to be a single atom, and that the atom be an oxygen atom or a sulfur atom.

In view of complexation, it is preferable that the triarylborane having a structure represented by the general formula (1), and a compound having an unshared electron pair, a metal or a metal compound be contained as components.

In view of improvement in stability of the complex, the triarylborane having a structure represented by the general formula (1) is preferably triarylborane having a structure represented by the general formula (2).

The composition containing organic borane of the present invention preferably contains the organic borane complex of the present invention in view of improvement in stability of the composition.

The organic electroluminescent element of the present invention preferably has an organic functional layer containing the organic borane complex of the present invention in view of improvement in performance of the element.

The present invention, the components thereof and the embodiments of the present invention are described in detail hereinafter. The word "to" hereinafter used with numerical values means that the numerical values written before and after the word are included as the lower limit and the upper limit.

<<Molecular Design of Organic Borane Complex>>

The organic borane complex of the present invention contains, as a component (building block), triarylborane in which three aryl groups and a boron atom are bonded through boron-carbon bonds.

At least two combinations of neighboring aryl groups of the above three aryl groups in this triarylborane have small steric hindrance and are crosslinked by an electron donative divalent atom. When this triarylborane forms the organic borane complex, an electron is supplied to an unoccupied 2P orbital of the boron atom from a compound having an unshared electron pair or a metal, whereby a coordinate bond is formed. The coordinate bond referred to herein means a chemical bond that bonding electrons are offered to the molecular orbital from only one of two atoms for forming the bond.

Then, the organic borane complex using, as a raw material, a substance capable of supplying an electron to the unoccupied 2P orbital of the boron atom of the triarylborane having a structure represented by the general formula (1) according to the present invention is a compound in conformity to essentially the same technical idea as the present invention, and therefore, this organic borane complex can be unambiguously determined to be the compound of the present invention.

<<Triarylborane>>

The triarylborane having a structure represented by the following general formula (1) according to the present invention is described below.

[Formula 3]

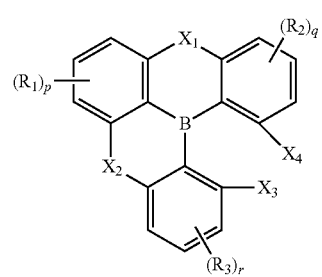

General formula (1)

In the above formula, $X_1$ and $X_2$ each independently represent an oxygen atom or a sulfur atom. $X_3$ and $X_4$ each independently represent a hydrogen atom or a substituent, or $X_3$ and $X_4$ are linked together to be a single atom. $R_1$ to $R_3$ each independently represent a hydrogen atom or a substituent. p, q and r each independently represent an integer of 1 to 3.

Examples of the substituents represented by $X_3$ and $X_4$ include a chain alkyl group, a cyclic alkyl group, an alkoxyl group, an aryloxy group, an ester group, a sulfonic ester group, a halogen atom, a cyano group, a hydroxyl group, an aromatic hydrocarbon ring group and an aromatic heterocyclic group.

The chain alkyl group may be straight-chain or branched. Examples of the straight-chain alkyl groups include a methyl group, an ethyl group, a propyl group, a butyl group, a pentyl group and a hexyl group.

Examples of the branched alkyl groups include an isopropyl group, an isobutyl group, a sec-butyl group, a tertbutyl group, a cyclopropylmethyl group, a cyclopropylethyl group, a cyclobutylmethyl group, a cyclobutylethyl group, a cyclopentylmethyl group, a cyclopentylethyl group, a cyclohexylmethyl group and a cyclohexylethyl group.

Examples of the cyclic alkyl groups include a cyclopropyl group, a cyclobutyl group, a cyclopentyl group, a cyclohexyl group and a cycloheptyl group.

Examples of the aromatic hydrocarbon ring groups include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group.

Examples of the alkoxyl groups include a methoxy group, an ethoxy group, a n-propoxy group, an isopropoxy group and a n-butoxy group.

Examples of the aryloxy groups include a phenoxy group and a naphthoxy group.

Examples of the ester groups include an acetoxy group and a benzoyloxy group.

Examples of the sulfonic ester groups include a methanesulfonic ester group, a trifluoromethanesulfonic ester group and a benzenesulfonic ester group.

Examples of the halogen atoms include a fluorine atom, a chlorine atom and a bromine atom.

Examples of the aromatic heterocyclic groups include a pyridyl group, a pyrimidinyl group, a furyl group, a pyrrolyl group, an imidazolyl group, a benzimidazolyl group, a pyrazolyl group, a pyrazinyl group, a triazolyl group, (e.g., a 1,2,4-triazol-1-yl group, a 1,2,3-triazol-1-yl group, etc.), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazolyl group (a group wherein one of carbon atoms to constitute a carboline ring of the above carbonylyl group is replaced with a nitrogen atom), a quinoxalinyl group, a pyridazinyl group, a triazinyl group, a quinazolinyl group and a phthalazinyl group.

These substituents may further have a substituent at an arbitrary position, and examples of such substituents include an aromatic groups, such as a phenyl group, a pyridyl group, a pyrrole group, a thienyl group, a furyl group, an imidazolyl group, a pyrimidyl group, a pyrazyl group, a pyridazyl group and a triazinyl group, condensed aromatic groups wherein the above aromatic groups are further condensed (e.g., a naphthyl group, a quinolyl group, an imidazolyl group, an indoloimidazolyl group, an imidazoimidazolyl group, a dibenzothienyl group, a dibenzofuryl group, an azadibenzofuryl group, benzimidazolyl group, quinazolyl group, benzopyrazinyl group, etc.), an aliphatic groups, such as an alkyl, a branched alkyl, a cycloalkyl, an alkenyl and alkynyl, substituents, such as a cyano group, an alkoxyl group, an aryloxy group, an alkylthio group, an arylthio group, an amino group, a carbonyl group, an acyl group, an ester group, a ureido group and a urethane group, and halogen atoms, such as a fluorine atom and a chlorine atom.

In the general formula (1), $X_3$ and $X_4$ may be linked together to be a single atom, and when $X_3$ and $X_4$ are linked together to be a single atom, the atom is preferably an oxygen atom or a sulfur atom.

In the general formula (1), $R_1$ to $R_3$ each independently represent a hydrogen atom or a substituent, and examples of the substituents include the same groups as the substituents described for the $X_3$ and $X_4$.

In the general formula (1), p, q and r each independently represent an integer of 1 to 3. When p, q and r are each 2 or 3, a plurality of $R_1$ to $R_3$ may be the same or different.

In an embodiment of the present invention, the triarylborane having a structure represented by the general formula (1) is preferably triarylborane having a structure represented by the general formula (2).

[Formula 4]

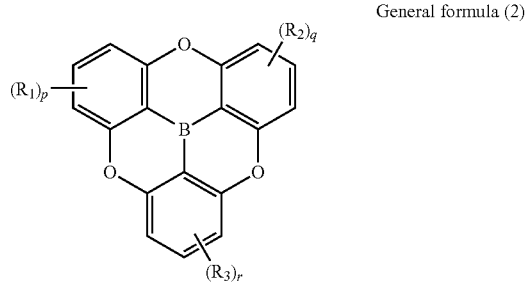

General formula (2)

In the above formula, $R_1$ to $R_3$ each independently represent a hydrogen atom or a substituent. p, q and r each independently represent an integer of 1 to 3.

Examples of the substituents represented by $R_1$ to $R_3$ include the same groups as the substituents represented by $R_1$ to $R_3$ in the aforesaid general formula (1). These substituents may further have a substituent at an arbitrary position.

When p, q and r are each 2 or 3, a plurality of $R_1$ to $R_3$ may be the same or different.

<Specific Examples of Triarylboranes>

Some examples of the triarylboranes having a structure represented by the general formula (1) or the general formula (2) according to the present invention are shown below.

[Formula 5]

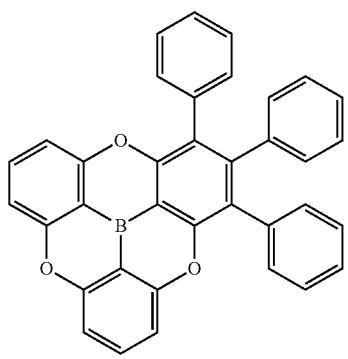

B1

B2
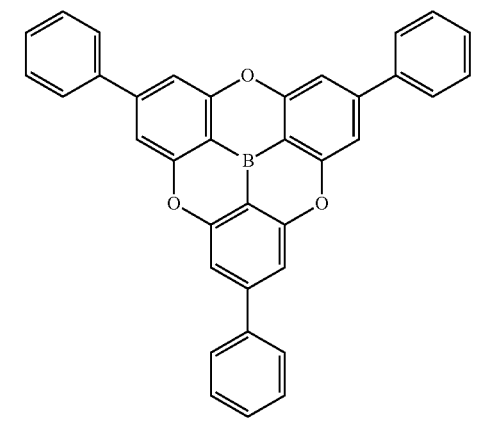
B3
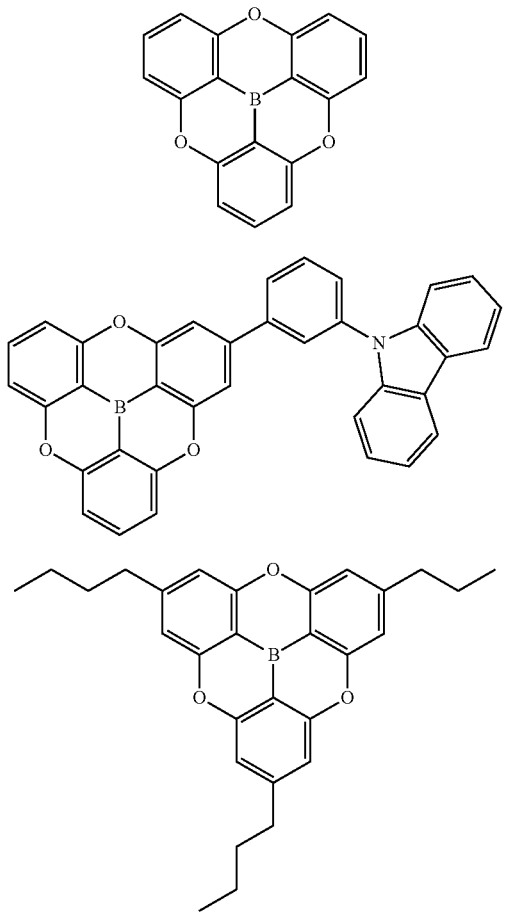
B4
B5
B6
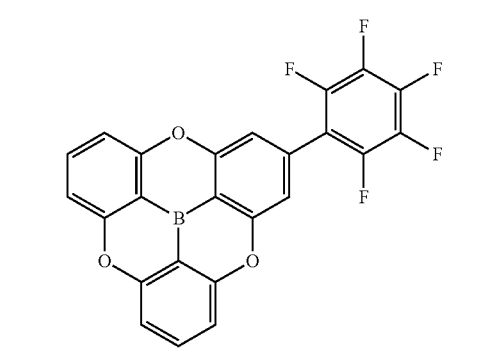
B7
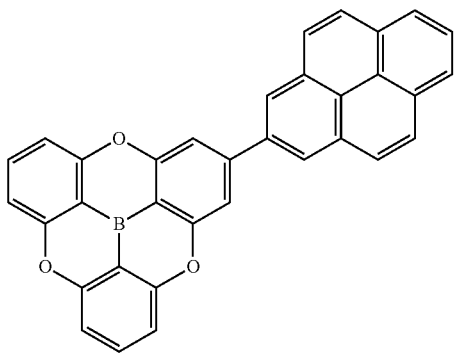
B8
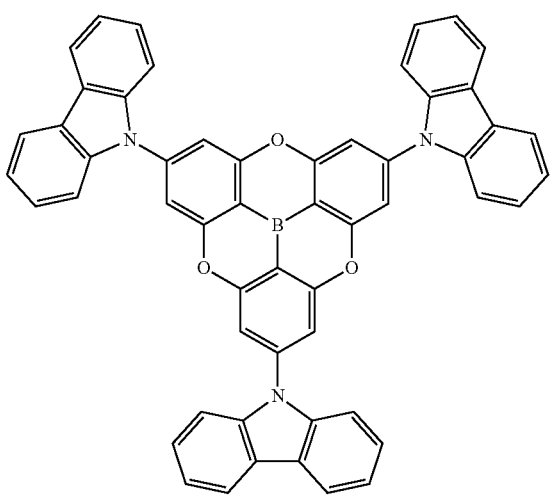
B9
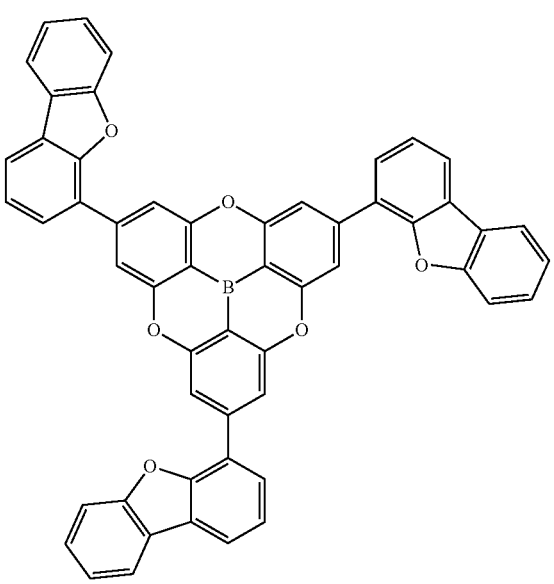

[Formula 6]
B10
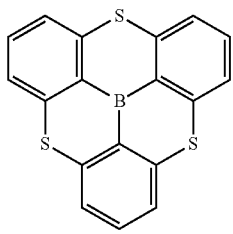
B11
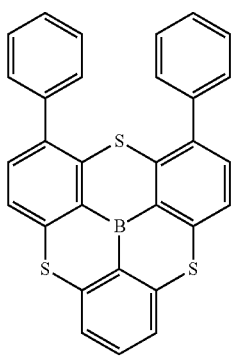
B12
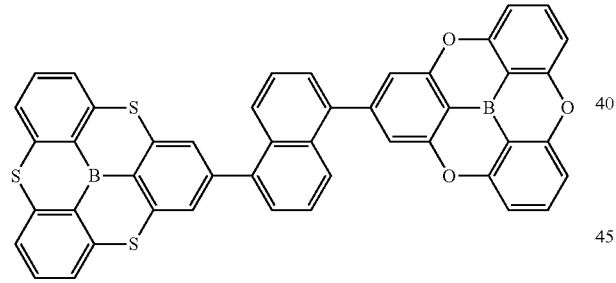
B13
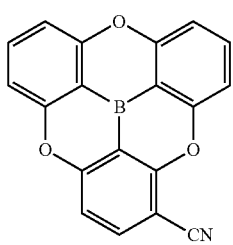
B14
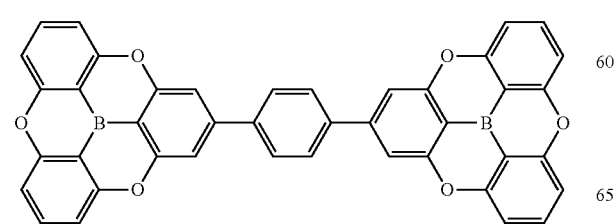
B15
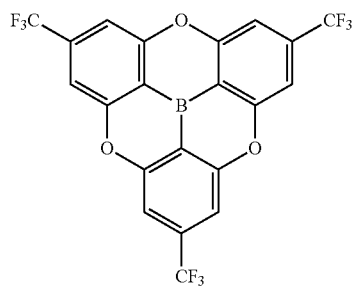
B16
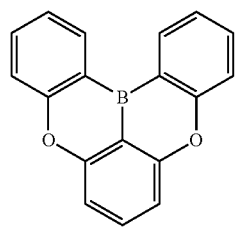
B17
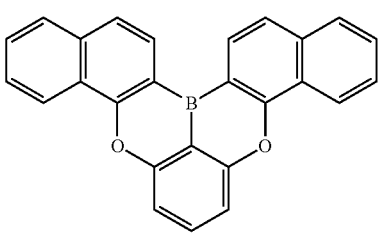
B18
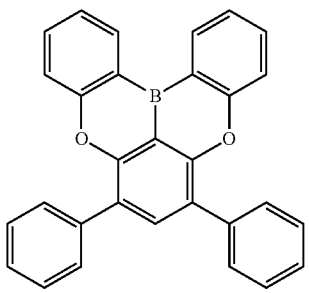
[Formula 7]
B19
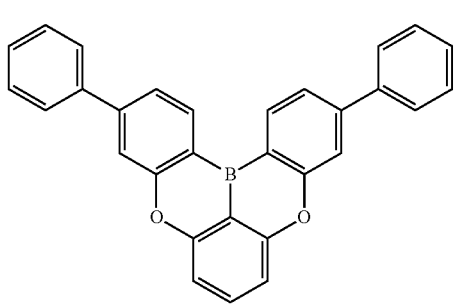

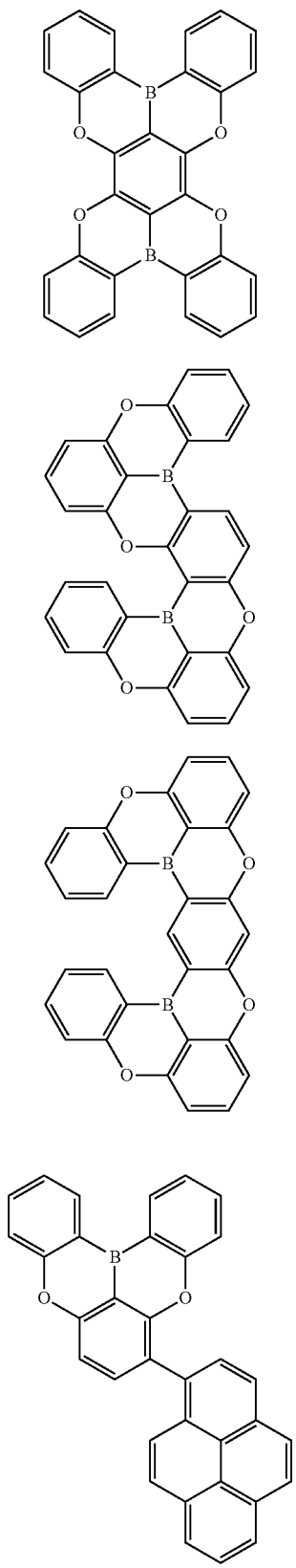
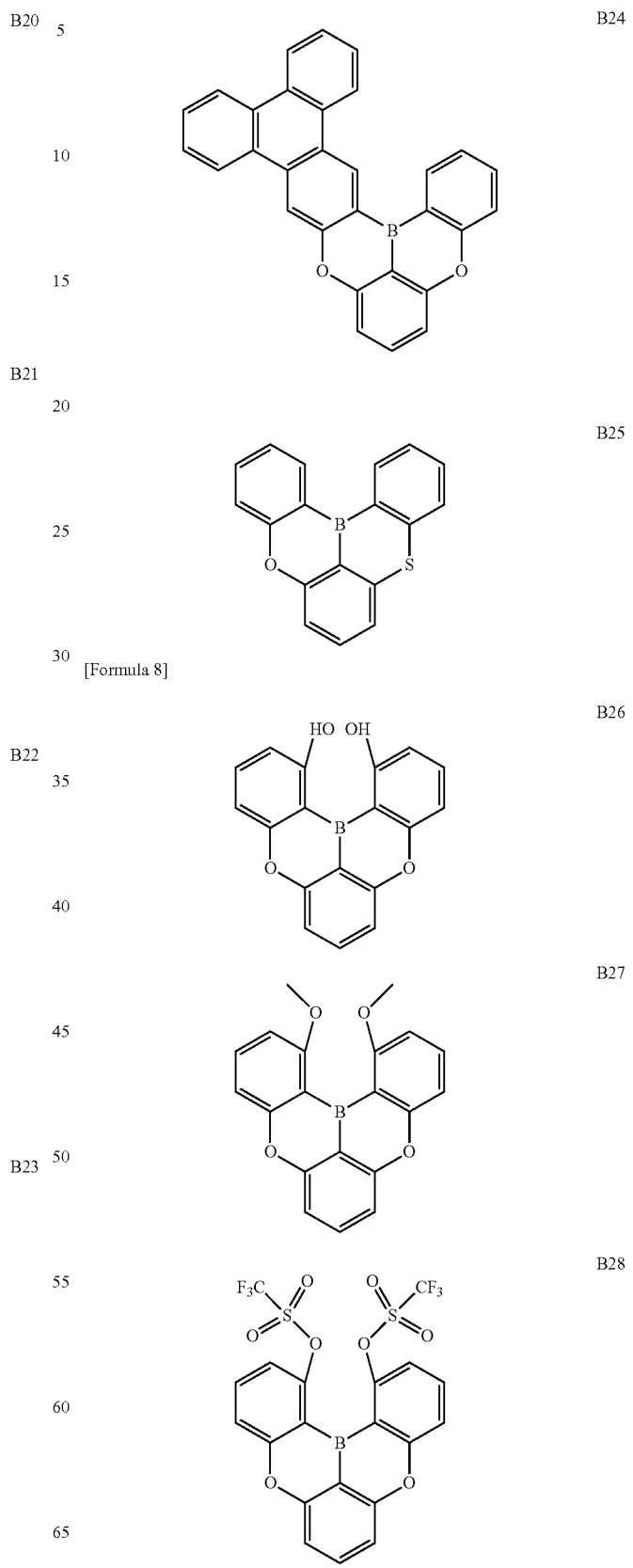

B29 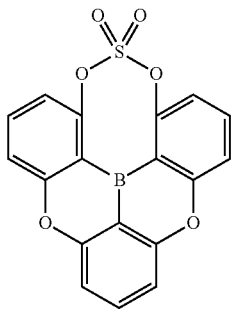

B30 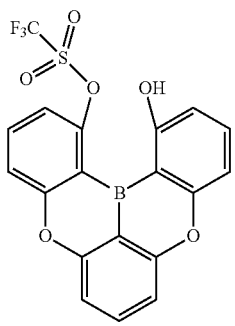

B31 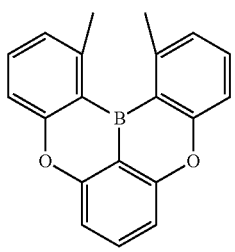

B32 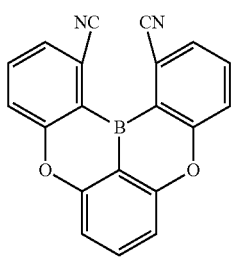

B33 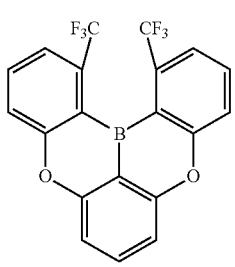

B34 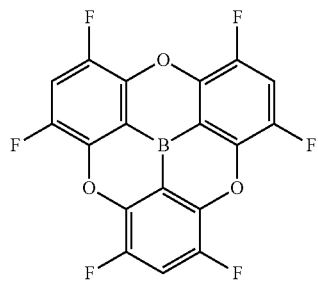

B35 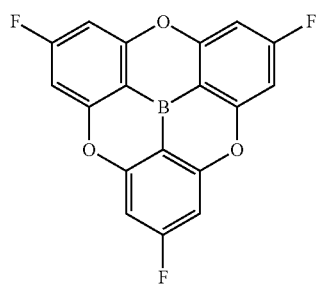

B36 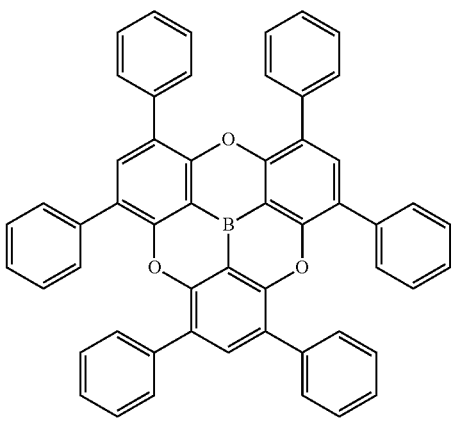

<<Organic Borane Complex>>

The organic borane complex containing, as a building block, triarylborane having a structure represented by the general formula (1) or the general formula (2) is described.

The building block means a component of the organic borane complex of the present invention.

The organic borane complex containing triarylborane as a building block means a complex formed by the reaction of the triarylborane having a structure represented by the general formula (1) with a substance capable of forming a coordinate bond.

The substance (X) capable of forming a coordinate bond is preferably a compound having an unshared electron pair, a metal or a metal compound. Specific examples thereof include amines (e.g., trialkylamines such as trimethylamine, dialkylamines such as diethylamine, aryldialkylamines such as dimethylphenylamine, triarylamines such as triphenylamine, cyclic amines such as piperidine and piperazine, etc.), aromatic heterocyclic compounds (e.g., pyridine, pyrimidine, azacarbazole, azadibenzofuran, imidazole, pyrazole, pyrrole, triazole, oxadiazole, oxazole, isoxazole, thiazole, thiadiazole, etc.), oxides (e.g., phosphine oxide, N-oxide of pyridine or trialkylamine, sulfoxide, etc.), typical metal atoms, transition metal atoms, ions thereof, halogen ions (fluorine ion, chlorine ion, etc.), and tetra-coordinated planar complexes (e.g., platinum orthometallic complex, nickel complex, zinc complex, etc.).

That is to say, the organic borane complex of the present invention preferably contains, as components, the triarylborane having a structure represented by the general formula (1) and a compound having an unshared electron pair, a metal or a metal compound.

When a plurality of boron atoms is present in a molecule of the triarylborane and/or when a plurality of coordinating atoms is present in a molecule of the substance capable of forming a coordinate bond, the organic borane complex may be a compound wherein they have reacted with each other to be linked like a supramolecule.

Moreover, a compound wherein the organic borane complex of the present invention has undergone interaction with a third component can also be included in the present invention. Examples of such compounds include a salt of an ate complex composed of the organic borane complex of the present invention and a metallic cation (e.g., sodium ion, potassium ion), a compound wherein the organic borane complex of the present invention includes fullerene (e.g., $C_{60}$, $C_{70}$, etc.), and a compound wherein the clathrates are linked like a supramolecule.

<Typical Examples of Organic Borane Complexes>

The organic borane complex is described using the aforesaid exemplary compound B3 as the triarylborane according to the present invention.

In the triarylborane according to the present invention, the boron atom is bonded to three aryl groups by bonds through $SP^2$ orbitals, and at the same time, an unoccupied 2P orbital is present on the boron atom. Accordingly, the exemplary compound B3 takes a disc-shaped structure, as shown below.

[Formula 9]

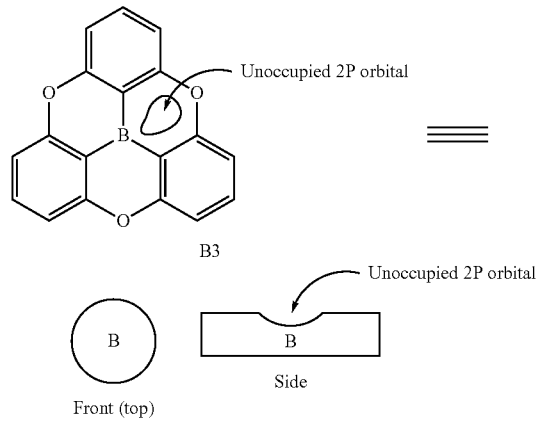

Next, when such triarylborane reacts with the substance (X) capable of forming a coordinate bond, the bonds from the boron atom become bonds through $SP^3$ orbitals, and the organic borane complex containing the exemplary compound B3 as a building block takes a deflected bowl-shaped structure, as shown below.

[Formula 10]

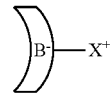

Typical examples of the organic borane complexes of the present invention are schematically shown below, but the present invention is not limited thereto.

[Formula 11]

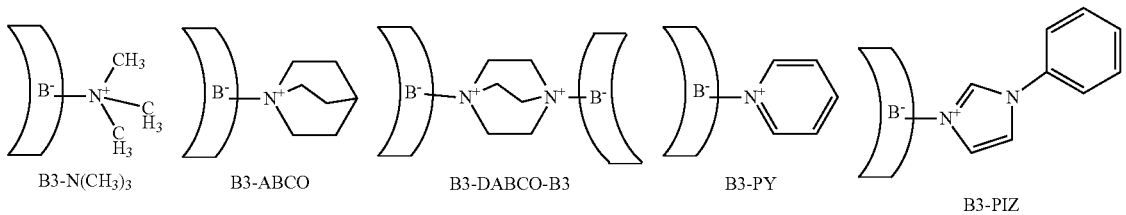

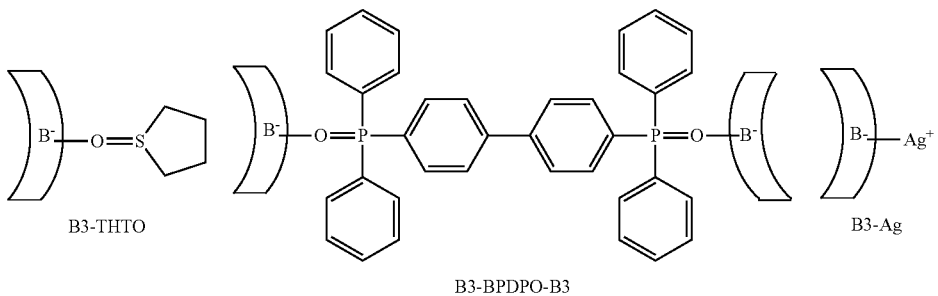

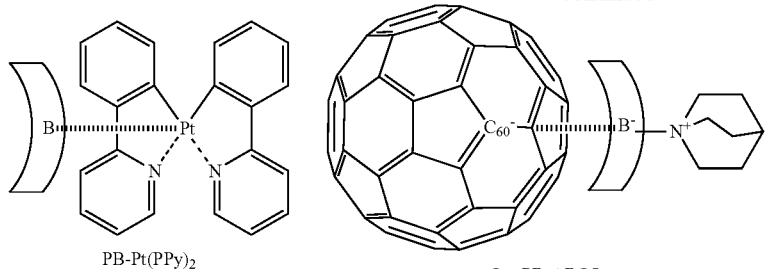

PB-Pt(PPy)₂

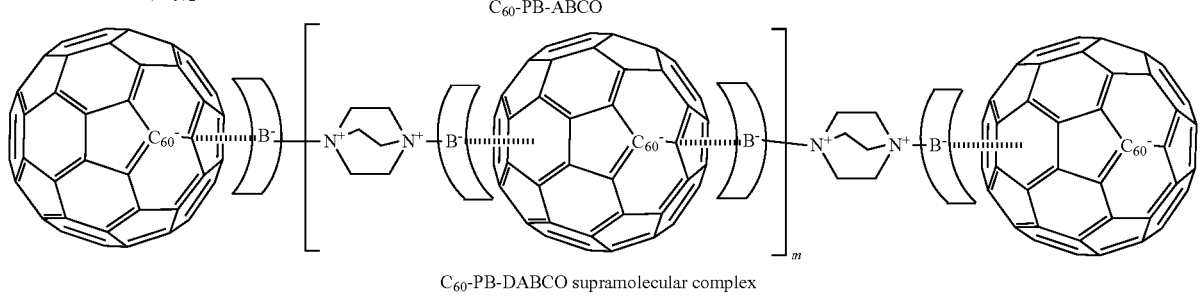

C₆₀-PB-ABCO

C₆₀-PB-DABCO supramolecular complex

<<Synthesis of Organic Borane Complex>>

Examples of solvents that can be used in the synthesis of the organic borane complex of the present invention include various solvents, such as alcohol-based, ester-based, ether-based, ketone-based, halogen-based, nitrile-based, amide-based and aromatic hydrocarbon-based solvents, and solvents of combinations thereof. Specific examples include methanol, ethanol, isopropanol, ethyl acetate, tetrahydrofuran, acetone, dichloromethane, acetonitrile, N,N-dimethylformamide, N,N-dimethylacetamide and toluene.

The amount of the solvent used is not particularly limited, but the solvent is preferably used in a 200-fold larger amount or less, and more preferably 5 to 50-fold larger amount, with respect to the amount of the raw material by weight.

In the present invention, the reaction temperature is preferably in the range of 0 to 120° C., and more preferably in the vicinity of room temperature (15 to 30° C.).

In the synthesis of the organic borane complex of the present invention, 0.9 to 1.2 molar equivalents of the substance capable of forming a coordinate bond are preferably used, and 1.0 to 1.1 molar equivalents of the substance capable of forming a coordinate bond are more preferably used, based on the number of moles of the triarylborane in terms of a boron atom.

<<Application of Organic Borane Complex to Electronic Device>>

By properly selecting the substance capable of forming a coordinate bond together with the triarylborane, the organic borane complex of the present invention can be obtained also as a complex having bipolarity.

Since the organic borane complex of the present invention can respond to various energy levels, it can be used not only as a luminescent (guest) material or a host material but also as a hole transport material, a hole injection material, an electron transport material or an electron injection material.

That is to say, the organic borane complex of the present invention can be used for organic functional layers of an organic EL element, such as a luminescent layer, a hole injection layer, a hole transport layer, an electron blocking layer, a hole blocking layer, an electron transport layer, an electron injection layer and an intermediate layer. The organic borane complex of the present invention can be used not only for an organic EL element but also for various electric devices.

<<Organic Electroluminescent Element>>

The organic electroluminescent element (also referred to as an organic EL element hereinafter) of the present invention is an organic EL element having organic functional layers including at least a luminescent layer between an anode and a cathode, and at least one layer of the organic functional layers contains the organic borane complex of the present invention.

The organic EL element containing the organic borane complex of the present invention can be preferably provided in a lighting device and a display device.

Examples of typical element structures in the organic EL element containing the organic borane complex of the present invention include, but are not limited to, the following structures.

(1) Anode/luminescent layer/cathode
(2) Anode/luminescent layer/electron transport layer/cathode
(3) Anode/hole transport layer/luminescent layer/cathode
(4) Anode/hole transport layer/luminescent layer/electron transport layer/cathode
(5) Anode/hole transport layer/luminescent layer/electron transport layer/electron injection layer/cathode
(6) Anode/hole injection layer/hole transport layer/luminescent layer/electron transport layer/cathode
(7) Anode/hole injection layer/hole transport layer/(electron blocking layer/) luminescent layer/(hole blocking layer/) electron transport layer/electron injection layer/cathode Of the above structures, the structure of (7) is preferably used, but the structure used is not limited thereto.

The luminescent layer is constituted of a single layer or a plurality of layers, and when the luminescent layer is constituted of a plurality of layers, a nonluminescent intermediate layer may be provided between luminescent layers.

If necessary, a hole blocking layer (also referred to as a hole barrier layer) or an electron injection layer (also referred to as a cathode buffer layer) may be provided between the luminescent layer and the cathode, or an electron blocking layer (also referred to as an electron barrier layer) or a hole injection layer (also referred to as an anode buffer layer) may be provided between the luminescent layer and the anode.

The electron transport layer is a layer having a function to transport electrons, and in a broad sense, the electron injection layer and the hole blocking layer are also included in the electron transport layers. The electron transport layer may be constituted of a plurality of layers.

The hole transport layer is a layer having a function to transport holes, and in a broad sense, the hole injection layer and the electron blocking layer are also included in the hole transport layers. The hole transport layer may be constituted of a plurality of layers.

The organic functional layers refer to layers excluding the anode and the cathode in the above-described typical element structures.

FIG. 1 shows an example of a structure of an organic EL element 1 of the present invention, and is a schematic view corresponding to the structure of (7) in the element structure examples. As shown in FIG. 1, organic functional layers F having a hole injection layer 4, a hole transport layer 5, a luminescent layer 6, an electron transport layer 7 and an electron injection layer 8 are provided between an anode 3 on a transparent substrate 2 and a cathode 9.

Figure 2:
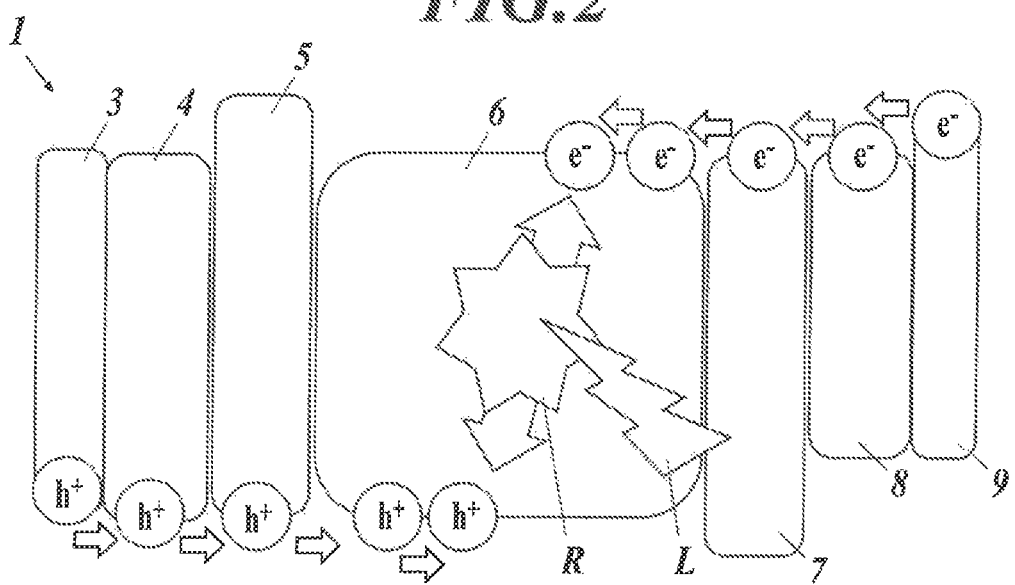
FIG. 2 is a schematic view showing a flow of electric charge in an organic EL element and mechanism of luminescence.

FIG. 2 is a schematic view showing a flow of electric charge in an organic EL element and mechanism of luminescence. When a voltage is applied to the organic EL element 1, an electron ($e^-$) is injected into the electron injection layer 8 from the cathode 9, and a hole ($h^+$) is injected into the hole injection layer 4 from the anode 3.

Subsequently, the electron and the hole are transported into the electron transport layer 7 and the hole transport layer 5, respectively, each of which is adjacent to the opposite side surface to the electrode.

Finally, the electron and the hole that have met in the luminescent layer 6 undergo recombination R to generate excitons. When they return to the ground state from the excited state, light (fluorescence, phosphorescence) L is released, and a luminescent element utilizing the L is an organic EL element. In FIG. 2, layers from the hole injection layer to the electron injection layer are organic functional layers.

<Electron Transport Material>

In order to make an electron flow into an organic compound, electric charge is injected into the organic functional layer from the electrode in the first step. As the injection mechanisms, two mechanisms of Schottky thermal radiation and tunnel injection are known, and electric charge injected into the organic functional layer brings about hopping conduction using, as a driving force, an external electric field applied between both electrodes, whereby current flows. The current at this time is space charge limited current (SCLC: space charge limited current) in conformity not to Ohm's law but to Child law, and this is inversely proportional to the cube of the layer thickness as indicated by the following formula (A), so that the layer thickness of the organic functional layer must be extremely thin.

Formula (A): amount of space charge limited current $\propto$ (voltage)$^2$/(layer thickness)$^3$ In an actual electronic display or lighting device, large current of several tens of A/m$^2$ needs to be made to flow at a voltage of several V, and therefore, in usual, the layer thickness of one layer is approximately not more than 50 nm.

<Solar Cell>

Figure 3:
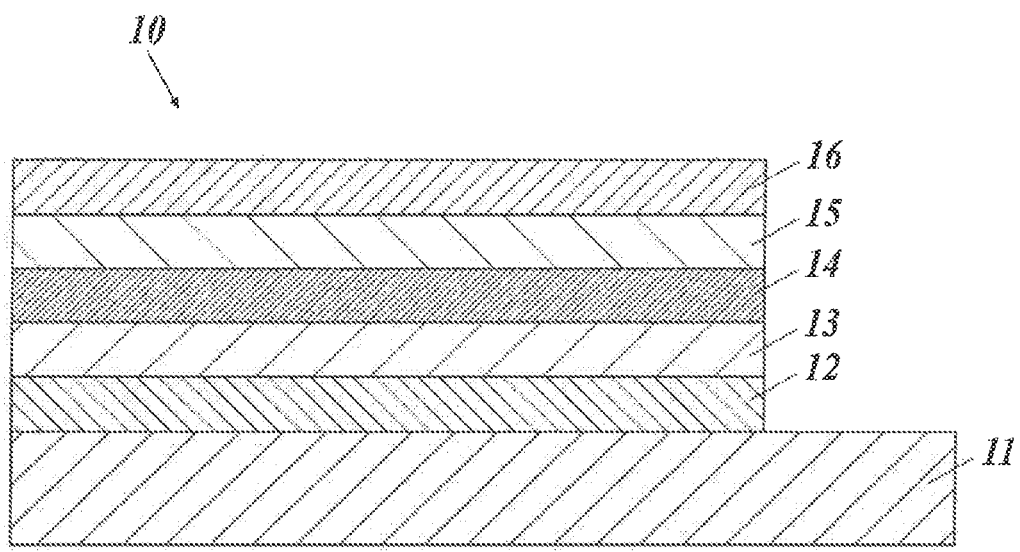
FIG. 3 is a sectional view showing an example of a structure of a solar cell formed of a bulk heterojunction type organic photoelectric conversion element.

FIG. 3 is a sectional view showing an example of a solar cell of a single structure (structure having one bulk heterojunction layer) formed of a bulk heterojunction type organic photoelectric conversion element. Referring to FIG. 3, in the bulk heterojunction type organic photoelectric conversion element 10, a transparent electrode (anode) 12, a hole transport layer 13, a photoelectric conversion section 14 of a bulk heterojunction layer, an electron transport layer (also referred to as a buffer layer) 15 and a counter electrode (cathode) 16 are successively laminated on one surface of a substrate 11.

The substrate 11 is a member to hold the transparent electrode 12, the photoelectric conversion section 14 and the counter electrode 16 that are successively laminated. Since light that is to be photoelectrically converted enters from the substrate 11 side, the substrate 11 is preferably a member capable of transmitting this light that is to be photoelectrically converted, that is, a member transparent to the wavelength of the light that should be photoelectrically converted. For example, a glass substrate, a resin substrate or the like is used as the substrate 11.

The photoelectric conversion section 14 is a layer to convert light energy into electrical energy, and is constituted by having a bulk heterojunction layer in which a p-type semiconductor material and an n-type semiconductor material are homogeneously mixed. The p-type semiconductor material relatively functions as an electron donor (donor), and the n-type semiconductor material relatively functions as an electron acceptor (acceptor). Here, the electron donor and the electron acceptor are "an electron donor and an electron acceptor such that when light is absorbed, an electron moves to the electron acceptor from the electron donor to form a pair of a hole and an electron (charge-separated state)", and differently from an electrode, they do not merely donate or accept an electron but donate or accept an electron through the photoreaction.

Referring to FIG. 3, the light having entered from the transparent electrode 12 through the substrate 11 is absorbed by the electron acceptor or the electron donor in the bulk heterojunction layer of the photoelectric conversion section 14, and an electron moves to the electron acceptor from the electron donor, whereby a pair of a hole and an electron (charge-separated state) is formed.

With regard to the charge generated, according to the internal electric field, for example, a potential difference between the transparent electrode 12 and the counter electrode 16 in the case where the transparent electrode 12 and the counter electrode 16 differ in work function, the electron passes between the electron acceptors, the hole passes between the electron donors, and the electron and the hole are transported to different electrodes, and photocurrent is detected.

For example, when the work function of the transparent electrode 12 is larger than the work function of the counter electrode 16, the electron is transported to the transparent electrode 12, and the hole is transported to the counter electrode 16. If the magnitude relation of the work function is reversed, the electron and the hole are each transported in the opposite direction to this. Alternatively, by applying a potential between the transparent electrode 12 and the counter electrode 16, the transport directions of the electron and the hole can be controlled.

Since the organic borane complex of the present invention can respond to various energy levels, it is a compound that easily undergoes electronic conduction. On that account, application of the organic borane complex of the present invention to various materials of a solar cell, particularly those of an organic solar cell, is possible.

<Transistor>

For the same reason as that of the solar cell, the organic borane complex of the present invention can be preferably used as a transistor material.

<Electrode/Charge Transfer Thin Film>

The organic borane complex of the present invention is a compound that easily undergoes electron hopping conduction, and when a thin film is formed of the compound itself, the thin film becomes a thin film that basically conducts electrons.

Some organic borane complexes of the present invention become conductive, for example, by being laminated with a metal such as silver, copper, nickel, iron or cobalt, or by allowing the metal to coexist, or by laminating the metal on a film in which the organic borane complex and the metal coexist, and such organic borane complexes can also be applied to a reflecting electrode, a transparent electrode, a semi-transparent electrode, and so on.

<<Composition Containing Organic Borane>>

The composition containing organic borane of the present invention only needs to contain a borane complex, and may be in the form of a film or a liquid. Specific examples thereof include an organic functional layer in an organic EL element, an organic functional layer in an organic photoelectric conversion element, an organic functional layer in a transistor, an electrode/charge transfer thin film, an ink-jet ink and an electrophotographic toner.

When the composition containing organic borane of the present invention is used for an organic functional layer in an organic EL element, the composition may further contain, for example, a hole injection material, a hole transport material, a host material, a dopant material, an electron transport material and an electron injection material.

When the composition containing organic borane of the present invention is used for an organic functional layer in an organic photoelectric conversion element, the composition may further contain, for example, a p-type organic semiconductor, an n-type organic semiconductor and a charge block material.

When the composition containing organic borane of the present invention is used for an organic functional layer in a transistor, the composition may further contain, for example, a p-type organic semiconductor and an n-type organic semiconductor.

When the composition containing organic borane of the present invention is used for an electrode/charge transfer thin film, the composition may further contain, for example, a metal and an alloy.

When the composition containing organic borane of the present invention is used as an ink-jet ink, the composition may further contain, for example, a dye, an activator and a solvent.

When the composition containing organic borane of the present invention is used as an electrophotographic toner, the composition may further contain, for example, a resin, a pigment, a wax and a stabilizer.

As the organic borane complex of the present invention, an organic borane complex produced in the system by the reaction of triarylborane with a substance capable of forming a coordinate bond can be used as it is in the compositions containing organic borane that are given above as examples, without taking it out of the system.

<<Superiority and Potential for Development of Organic Borane Complex>>

The greatest significance of the present invention is that an organic borane complex containing, as a building block, triarylborane which has not been practically used at all in terms of durability in an environment to which electronic devices are exposed, particularly in air or at a high temperature or during application of an electric field, has been able to be created. That is to say, by using triarylborane having a structure represented by the general formula (1) or (2) according to the present invention in a conventional organic borane complex, stability of the resulting organic borane complex can be more remarkably improved than that of the conventional organic borane complex.

Moreover, the organic borane complex satisfying the requirements of the present invention is universally improved in stability and can be applied to various industrial products, and this is greater technical progress than ever before, so that the organic borane complex can be said to be an essential invention that is unprecedented so far.

Example 1

The present invention is specifically described below with reference to examples, but the embodiment of the present invention is not limited to these examples. Unless otherwise noted, the indication "part(s)" used in the examples means "part(s) by mass".

Synthesis Example 1: B3-DABCO-B3

The exemplary compound B3-DABCO-B3 of the present invention was synthesized by the procedure described below (regarding detailed synthesis procedure, see Y. Kitamoto, et al. Chem Commun., 2016, 52, 7098-7101).

[Scheme 1]

Using 1-iodo-3-methoxybenzene and 1,3-dihydroxybenzene as raw materials, etherification reaction using a copper catalyst was carried out, thereby obtaining a triphenyl ether body B3-3-1 in a yield of 95%.

[Formula 12]

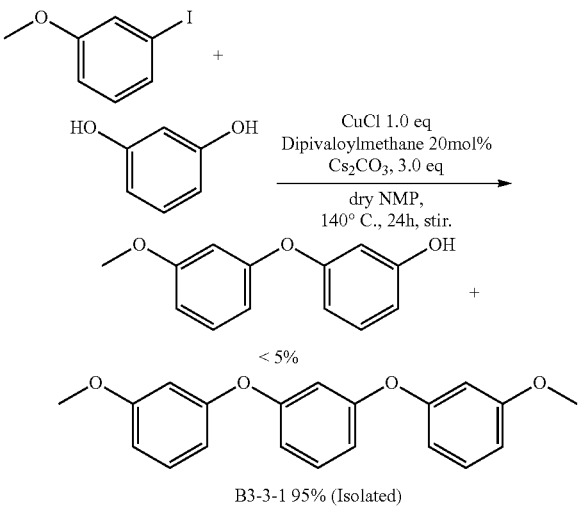

[Scheme 2]

Next, n-BuLi was dropwise added to the B3-3-1 to carry out trilithiation reaction, thereby obtaining B3-3-2 as a reaction intermediate.

Subsequently, borylation reaction was carried out. Specifically, to a THF/benzene mixed solution of the B3-3-2, one equivalent of $BF_3/OEt_2$ was dropwise added over a period of 10 minutes, thereafter the temperature was raised, and the mixture was heated and refluxed for 21 hours. Thereafter, reaction treatment and purification were carried out, thereby obtaining B-3-3 (B27) in a yield of 15%.

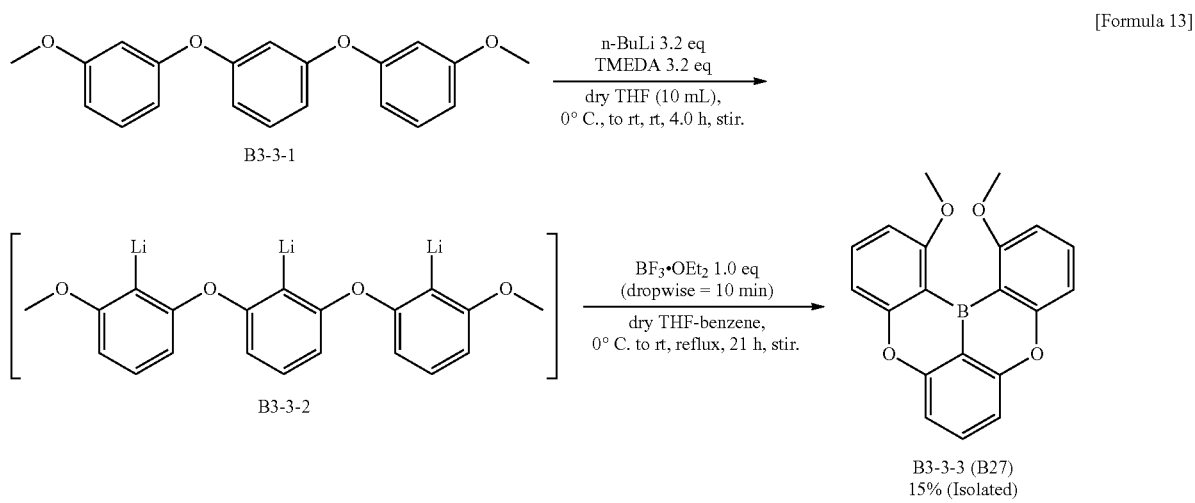

[Scheme 3]

Next, using BBr$_3$, deblocking was carried out. By dropwise adding BBr$_3$ to a methylene chloride solution at 78° C., the reaction quantitatively proceeded without dissociation of boron-carbon bond, thereby obtaining B3-3-4 (B26) in a yield of 94%.

Further, a reaction to convert one carboxyl group of the B3-3-4 (B26) into a sulfonyl group was carried out using trifluoromethanesulfonic anhydride (Tf$_2$O), thereby obtaining B3-3-5 (B30) in a yield of 94%.

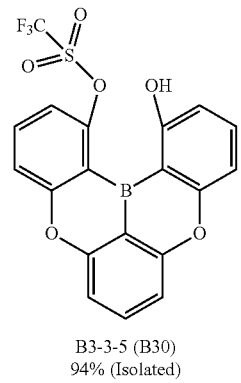

B3-3-5 (B30)
94% (Isolated)

[Scheme 4]

Next, using diazabicycloundecene (1,8-diazabicyclo[5.4.0]undec-7-ene: DBU) as a base, N,N-dimethylformamide (N,N-dimethylformamide: DMF) as a solvent, and a microreactor using microwaves (MW), the B3-3-5 was subjected to reaction at 240° C. for 4 hours, thereby obtaining B3 in a yield of 87%.

[Formula 14]

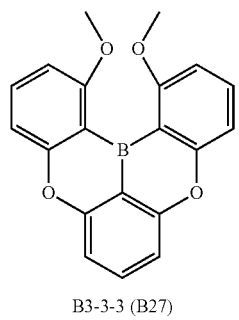

[Formula 15]

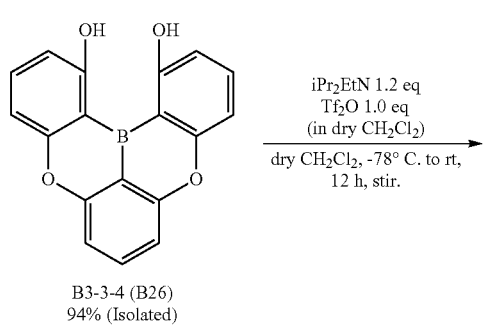

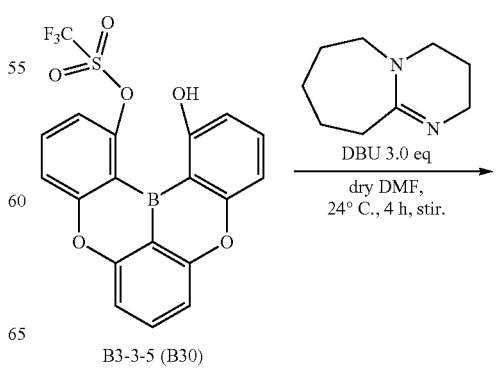

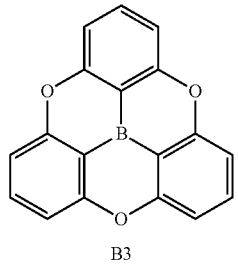

B3

[Synthesis of Organic Borane Complex]

To 100 parts of chloroform, 1.00 part of the B3 and 0.20 parts of 1,4-diazabicyclo[2.2.2]octane (DABCO) were added at room temperature, and they were stirred for 3 hours. After completion of the reaction, the solvent was concentrated under reduced pressure, and when crystals appeared, concentration was stopped, followed by allowing the crystals to stand still as they were overnight at room temperature. The resulting crystals were filtered and washed with cold chloroform, thereby obtaining 0.85 parts of B3-DABCO-B3.

($^1$H-NMR Spectral Analysis)

$^1$H-NMR (deuterated chloroform solvent) of the B3-DABCO-B3 obtained above was measured, and the B3-DABCO-B3 was confirmed to be an organic borane complex of B3 and DABCO (see FIG. 4).

Measuring device: Bruker Biospin AVANCE III 400 spectrometer (400 MHz for $^1$H-NMR)

Measurement conditions: 23° C. (296 K), using $CDCL_3$ solvent, tetramethylsilane standard (0 ppm)

Spectral data: B3 ($CDCl_3$, 400 MHz) δ: 7.74 (3H, t), 7.22 (6H, d), DABCO ($CDCl_3$, 400 MHz) δ: 2.79 (12H, s), B3-DABCO-B3 ($CDCl_3$, 400 MHz) δ: 7.13 (3H, t), 6.84 (6H, d), 3.01 (12H, brs).

(Single Crystal X-Ray Structure Analysis)

Figure 5A:
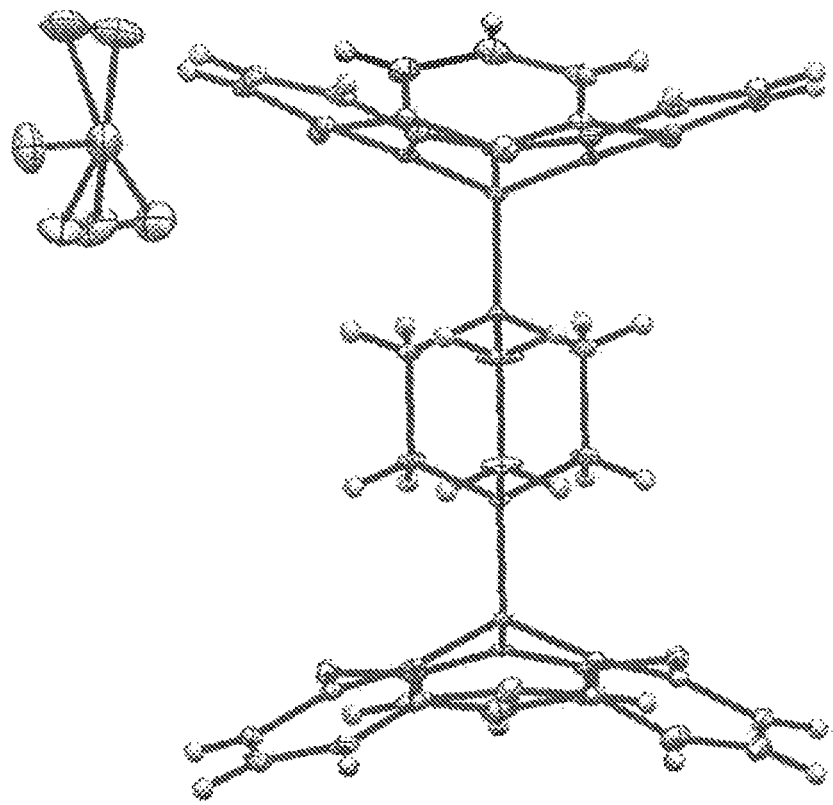
FIG. 5A is a side view showing a crystal structure of an organic borane complex of the present invention.
Figure 5B:
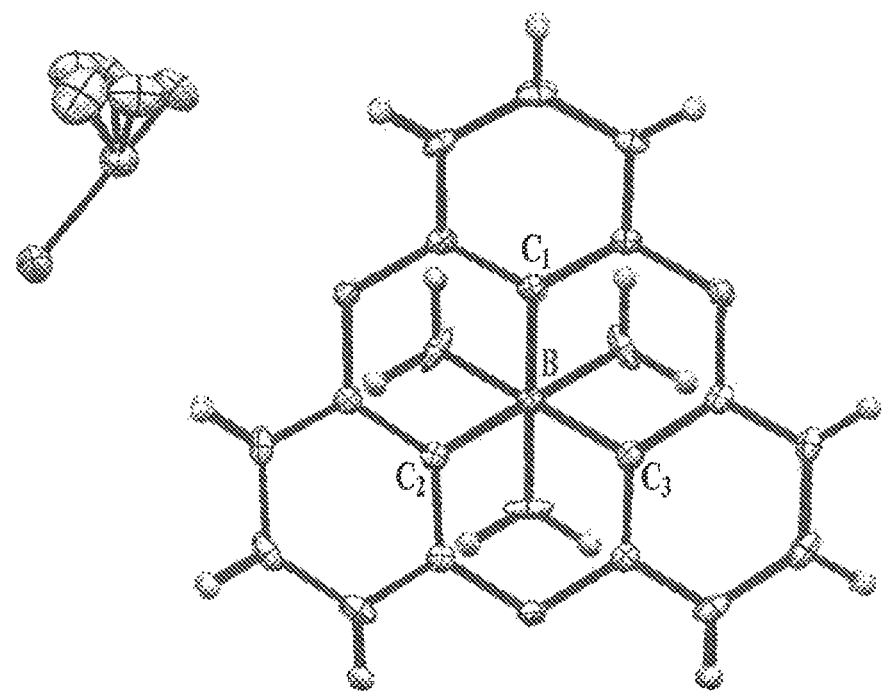
FIG. 5B is a top view showing a crystal structure of an organic borane complex of the present invention.

The resulting B3-DABCO-B3 was subjected to single crystal X-ray structure analysis. The results are shown in FIG. 5. The distances between the boron atom (B) of the B3 moiety and carbon atoms ($C_1$ to $C_3$) bonded thereto were: B—$C_1$=1.562 Å, B—$C_2$=1.563 Å, and B—$C_3$=1.567 Å.

(Crystallographic data: Monoclinic, C2/c, a=23.783(3) A, b=9.9498(10) A, c=18.2611(19) A, 13=113.2150(10°), Z=8, d=1.538 g/cm$^3$, V=3971.42 Å$^3$, $R_1$=0.0549, w$R_2$=0.1538.)

Figure 6A:
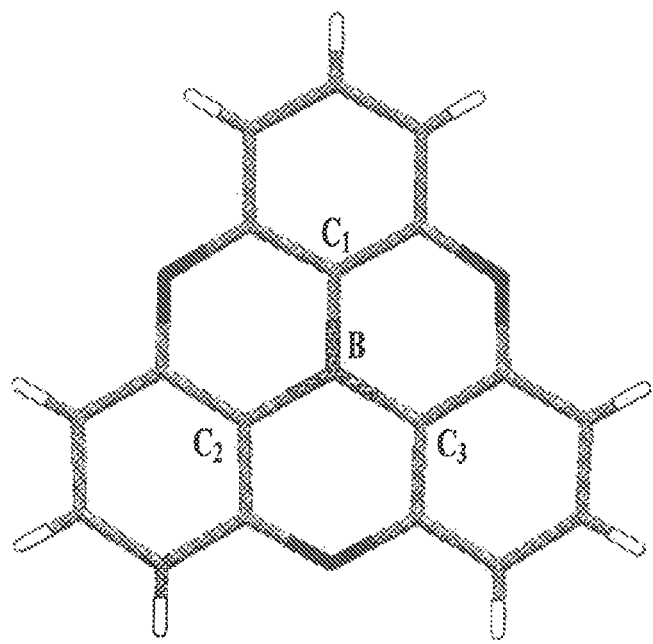
FIG. 6A is a top view showing a crystal structure of triarylborane according to the present invention.
Figure 6B:
FIG. 6B is a side view showing a crystal structure of triarylborane according to the present invention.

On the other hand, the results of the single crystal X-ray structure analysis of the exemplary compound B3 shown in FIG. 6 were: B—$C_1$=1.459 Å, B—$C_2$=1.461 Å, and B—$C_3$=1.459 Å.

From the results of the single crystal X-ray structure analysis, it can be seen that owing to the reaction with DABCO that was a substance capable of forming a coordinate bond, bonding between the boron atom and the carbon atoms on the aryl groups in the triarylamine B3 changed to a SP$^3$ orbital from a SP$^2$ orbital.

The single crystal X-ray structure analysis was carried out by the following measuring device under the following measurement conditions.

Measuring device: Bruker Smart APEX II ULTRA

Measurement conditions: measuring temperature/−173° C., ray source/MoKα (λ=0.7103 Å), Data integration and reduction/SAINT and XPREP software, Absorption correction/semiempirical method with SADABS, Structure/solved by direct method using SHELXL-97 and refined by using least-squares method on F$^2$ with SHELXL-97.

Synthesis Example 2: B3-PY

To 100 parts of chloroform, 1.00 part of the B3 and 0.28 parts of pyridine were added at room temperature, and they were stirred for 3 hours. After completion of the reaction, the solvent was concentrated under reduced pressure, and when crystals appeared, concentration was stopped, followed by allowing the crystals to stand still as they were overnight at room temperature. The resulting crystals were filtered and washed with cold chloroform, thereby obtaining 0.73 parts of B3-PY.

($^1$H-NMR Spectral Analysis)

$^1$H-NMR (deuterated chloroform solvent) of the resulting B3-PY was measured in the same manner as in Synthesis Example 1. As a result, a peak derived from the B3 that was a raw material disappeared, and a peak occurred at a new position, so that it was confirmed that an organic borane complex of the B3-PY had been produced.

<<Comparison of Heat Resistance>>

The B3-PY of the present invention and the following triphenylborane pyridine complex were placed in different glass sealed tubes, and they were heated to 300° C. After heating at 300° C. for one hour, the B3-PY was taken out of the glass tube, and $^1$H-NMR was measured. As a result, it was confirmed that the B3-PY was not decomposed at all.

[Formula 16]

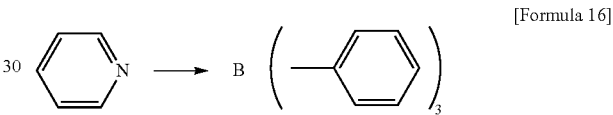

On the other hand, after the triphenylborane pyridine complex was heated at 300° C. for one hour, $^1$H-NMR was measured, and as a result, a large number of new peaks different from a peak of the triphenylborane pyridine complex appeared, so that it was confirmed that decomposition had occurred.

In addition, the B3-DABCO-B3 of the present invention was subjected to a heat resistance test under the same conditions as above, and as a result, it was confirmed that the B3-DABCO-B3 was not decomposed at all.

From the above results, it can be seen that the compounds B3-PY and B3-DABCO-B3 of the present invention had sufficient heat stability as compared with the triphenylborane pyridine complex conventionally known.

<<Use as Electron Transport Material in Organic EL Element>>

Using the compound B3-PY of the present invention as an electron transport material, an organic EL element was prepared.

A glass substrate having an ITO (indium tin oxide) film of 100 nm formed as an anode was subjected to ultrasonic cleaning with isopropyl alcohol, then subjected to drying with dry nitrogen gas and UV ozone cleaning, and fixed to a substrate holder of a vacuum deposition device.

The degree of vacuum in the vacuum deposition device was reduced down to 1×10$^{-4}$ Pa, and thereafter, on the anode were formed a layer of hexacyano-hexaazatriphenylene (15 nm) as a hole injection layer and a layer of α-NPD (4,4'-bis[N-(1-naphthyl)-N-phenylamino]biphenyl) (30 nm) as a hole transport layer in this order.

Subsequently, for a luminescent layer, 1,3-bis(N-carbazolyl)benzene (mCP) functioning as a host compound and bis[2-(4,6-difluorophenyl)pyridinato-C2,N](picolinato) iridium(III) (Flrpic) functioning as a luminescent material were co-deposited in a ratio of mCP:Flrpic=100:6, thereby providing a luminescent layer having a thickness of 30 nm.

Subsequently, the compound B3-PY of the present invention (15 nm) for an electron transport layer, lithium fluoride (1.0 nm) for an electron injection layer and aluminum (100 nm) for a cathode were deposited in this order, thereby preparing an organic EL element.

To the resulting organic EL element, constant current of 2.5 mA/cm$^2$ was made to flow at room temperature, and as a result, the organic EL element emitted blue light. From this result, it was confirmed that the B3-PY of the present invention functioned as an electron transport material in the organic EL element, and it can be seen that the B3-PY exhibited charge conduction property.

<<Use as Hole Transport Material in Organic EL Element>>

Using the compound B3-PY of the present invention as a hole transport material, an organic EL element was prepared.

A glass substrate having an ITO film of 100 nm formed as an anode was subjected to ultrasonic cleaning with isopropyl alcohol, then subjected to drying with dry nitrogen gas and UV ozone cleaning, and fixed to a substrate holder of a vacuum deposition device.

The degree of vacuum in the vacuum deposition device was reduced down to $1\times10^{-4}$ Pa, and thereafter, on the anode were formed a layer of hexacyano-hexaazatriphenylene (12 nm) as a hole injection layer and a layer of the compound B3-DABCO-B3 of the present invention (40 nm) as a hole transport layer in this order.

Subsequently, for a luminescent layer, 1,3-bis(N-carbazolyl)benzene (mCP) functioning as a host compound and bis[2-(4,6-difluorophenyl)pyridinato-C2,N](picolinato) iridium(III) (Flrpic) functioning as a luminescent material were co-deposited in a ratio of mCP:Flrpic=100:6, thereby providing a luminescent layer having a thickness of 30 nm.

Subsequently, 4,7-diphenyl-1,10-phenanthroline (BPhen) (30 nm) for an electron transport layer, lithium fluoride (1.0 nm) for an electron injection layer and aluminum (100 nm) for a cathode were deposited in this order, thereby preparing an organic EL element.

To the resulting organic EL element, constant current of 2.5 mA/cm2 was made to flow at room temperature, and as a result, the organic EL element emitted blue light. From this result, it was confirmed that the B3-PY of the present invention functioned as a hole transport material in the organic EL element, and it can be seen that the B3-PY exhibited charge conduction property.

By the above means of the present invention, an organic borane complex containing, as a component, triarylborane strengthened in bonding between a boron atom and a carbon atom on an aryl group, a composition containing organic borane, and an organic electroluminescent element can be provided.

The mechanism for development of the effects of the present invention and the mechanism for the action of the present invention have not been made clear, but they are thought as follows: specifically, in the organic borane complex of the present invention, triarylborane has small steric hindrance, and an arbitrary aryl group of the triarylborane are crosslinked by an electron donative divalent atom, to provide compatibility of ease of forming a coordinate bond between this compound and a compound having an unshared electron pair or a metal with stability of the resulting organic borane complex.

It is thought that for these characteristics, existence of an oxygen atom or a sulfur atom as a crosslinking group of the aryl group around the boron atom in triarylborane is important. In other words, it is thought that in the synthesis of an organic borane complex of the triarylborane and a compound having an unshared electron pair or a metal, the compound having an unshared electron pair or the metal and the triarylborane can easily come close to each other to form a coordinate bond because of no large steric hindrance when they react with each other. Moreover, it is presumed that boron-carbon bonds between a boron atom and three aryl groups are strengthened, whereby the organic borane complex is less susceptible to decomposition due to heat, moisture or oxygen.

Although embodiments of the present invention have been described and illustrated in detail, the disclosed embodiments are made for purposes of illustration and example only and not limitation. The scope of the present invention should be interpreted by terms of the appended claims.

INDUSTRIAL APPLICABILITY

The organic borane complex of the present invention can be used for organic functional layers of an organic EL element, such as a luminescent layer, a hole injection layer, a hole transport layer, an electron blocking layer, a hole blocking layer, an electron transport layer, an electron injection layer and an intermediate layer. The organic borane complex of the present invention can be used not only for an organic EL element but also for various electric devices such as a solar cell and a transistor.

The composition containing organic borane of the present invention can be used not only for an organic functional layer in an organic EL element, an organic functional layer in an organic photoelectric conversion element, an organic functional layer in a transistor, and an electrode/charge transfer thin film but also for an ink-jet ink, an electrophotographic toner, and so on.

REFERENCE SIGNS LIST

1 Organic EL element
2 Transparent substrate
3 Anode
4 Hole injection layer
5 Hole transport layer
6 Luminescent layer
7 Electron transport layer
8 Electron injection layer
9 Cathode
10 Bulk heterojunction type organic photoelectric conversion element
11 Substrate
12 Transparent electrode (anode)
13 Hole transport layer
14 Photoelectric conversion section (bulk heterojunction layer)
15 Electron transport layer
16 Counter electrode (cathode)
F Organic functional layers
R Recombination
L Light

The invention claimed is:

1. An organic borane complex comprising a complex formed by reacting triarylborane with an amine compound or a heteroaryl compound, the triarylborane having a structure represented by the following general formula (1):

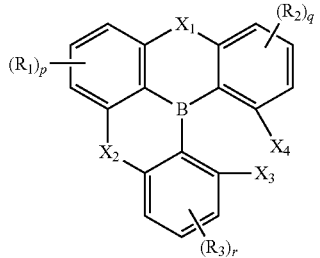

General formula (1)

wherein $X_1$ and $X_2$ each independently represent an oxygen atom or a sulfur atom; $X_3$ and $X_4$ are linked together to be an oxygen atom or a sulfur atom; $R_1$ to $R_3$ each independently represent a hydrogen atom or a substituent provided that at least one of $R_1$ to $R_3$ represents the substituent; the substituent is a chain alkyl group, a cyclic alkyl group, an alkoxyl group, an aryloxy group, an ester group, a sulfonic ester group, a halogen atom, a cyano group, or a hydroxyl group; and p, q and r each independently represent an integer of 1 to 3.

2. A composition containing organic borane, the composition comprising the organic borane complex according to claim 1.

3. An organic electroluminescent element having an organic functional layer comprising the organic borane complex according to claim 1.

* * * * *